United States Patent
Bonella et al.

[11] Patent Number: 5,818,794
[45] Date of Patent: Oct. 6, 1998

[54] INTERNALLY CONTROLLED SIGNAL SYSTEM FOR CONTROLLING THE OPERATION OF A DEVICE

[75] Inventors: Randy M. Bonella, Portland; Peter D. MacWilliams, Aloha, both of Oreg.

[73] Assignee: Intel Corporation, Santa Clara, Calif.

[21] Appl. No.: 857,798

[22] Filed: May 16, 1997

[51] Int. Cl.[6] .................................................. G11C 8/00
[52] U.S. Cl. .............. 365/236; 365/189.05; 365/189.12; 365/230.08
[58] Field of Search ............................... 365/236, 189.05, 365/189.12, 230.08

[56] References Cited

U.S. PATENT DOCUMENTS

| | | | |
|---|---|---|---|
| 5,255,378 | 10/1993 | Crawford et al. | 395/325 |
| 5,479,370 | 12/1995 | Furuyama et al. | 365/189.12 |
| 5,521,876 | 5/1996 | Hattori et al. | 365/221 |
| 5,530,670 | 6/1996 | Matsumoto | 365/189.01 |
| 5,604,884 | 2/1997 | Thome et al. | 395/494 |

*Primary Examiner*—David C. Nelms
*Assistant Examiner*—Hien Nguyen
*Attorney, Agent, or Firm*—Blakely, Sokoloff, Taylor & Zafman

[57] ABSTRACT

A control mechanism is provided for controlling the operation of a memory device. The control mechanism is contained within the memory device, and includes a buffer that receives data stored in the memory device and transmits the data to an output of the memory device. A logic device is coupled to the buffer controls the flow of data through the buffer by generating an output enable signal. The control mechanism may also include a counter coupled to a memory array. The counter identifies a memory entry within the memory array. A logic device is coupled to the counter and controls the operation of the counter.

20 Claims, 10 Drawing Sheets

INTERNALLY CONTROLLED SIGNAL SYSTEM FOR CONTROLLING THE OPERATION OF A DEVICE

FIELD OF THE INVENTION

The present invention relates to a system for generating control signals. More specifically, the invention provides an internal system for controlling the operation of a device.

BACKGROUND

Various types of signals are used to control the operation of devices, such as electronic devices. In certain situations, a control device may be utilized to generate signals to control other devices. In other situations, a particular device may generate a portion of its own control signals and receive other control signals from an external source.

Using an external device to generate control signals for transmission to a controlled device increases the complexity of the system. Devices that rely on control signals generated by an external source require additional connections (e.g., connector pins or integrated circuit pins) to receive the external control signals, thereby reducing the number of connections available for other uses. The use of external control signals also requires additional communication links (e.g., wires or traces) to communicate the control signals from the signal source to the controlled device. These additional communication links increase the size of the wire bundles or the area required to route traces. This added complexity increases the overall cost of the system.

The distance between the external source of control signals and the controlled device may further complicate the system. For example, the external device and the control device must consider the delay associated with the transmission of the control signals between the two devices. Additionally, noise or distortion induced during the transmission of the control signals may degrade the signal quality, thereby increasing the likelihood of improper operation of the controlled device.

It is therefore desirable to provide a system that reduces the number of control signals received from an external source.

SUMMARY OF THE INVENTION

The present invention provides an internal system for controlling the operation of a device. An embodiment of the invention provides a control mechanism located within a memory device to control the operation of the memory device. The control mechanism includes a buffer configured to receive data stored in the memory device and transmit the data to an output of the memory device. A logic device is coupled to the buffer and controls the flow of data through the buffer.

In a particular embodiment of the invention, the logic device generates an output enable signal that controls the flow of data through the buffer.

Other embodiments of the invention include a counter coupled to a memory array, in which the counter identifies a memory entry within the memory array. In these other embodiments, a logic device is coupled to the counter to control the operation of the counter.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

DETAILED DESCRIPTION

The following detailed description sets forth numerous specific details to provide a thorough understanding of the invention. However, those of ordinary skill in the art will appreciate that the invention may be practiced without these specific details. In other instances, well-known methods, procedures, components, protocols, and circuits have not been described in detail so as not to obscure the invention.

The present invention is related to a system for reducing the number of externally-generated control signals. A control system is provided by the present invention for internally generating control signals within a device. The internal generation of control signals reduces the number of external control signals required to operate the device. This internal generation of control signals simplifies the device's external interface by reducing the number of high-speed external control signal interfaces. By reducing the number of external control signals required to operate the device, the number of pins on the device is also reduced. This reduction in the number of pins simplifies the implementation of the device and its packaging.

The teachings of the present invention can be applied to various types of devices. For purposes of explanation, various examples are provided below in which the device is a memory device. Those of ordinary skill in the art will appreciate that the explanations and examples are also applicable to other types of devices.

Figure 1:
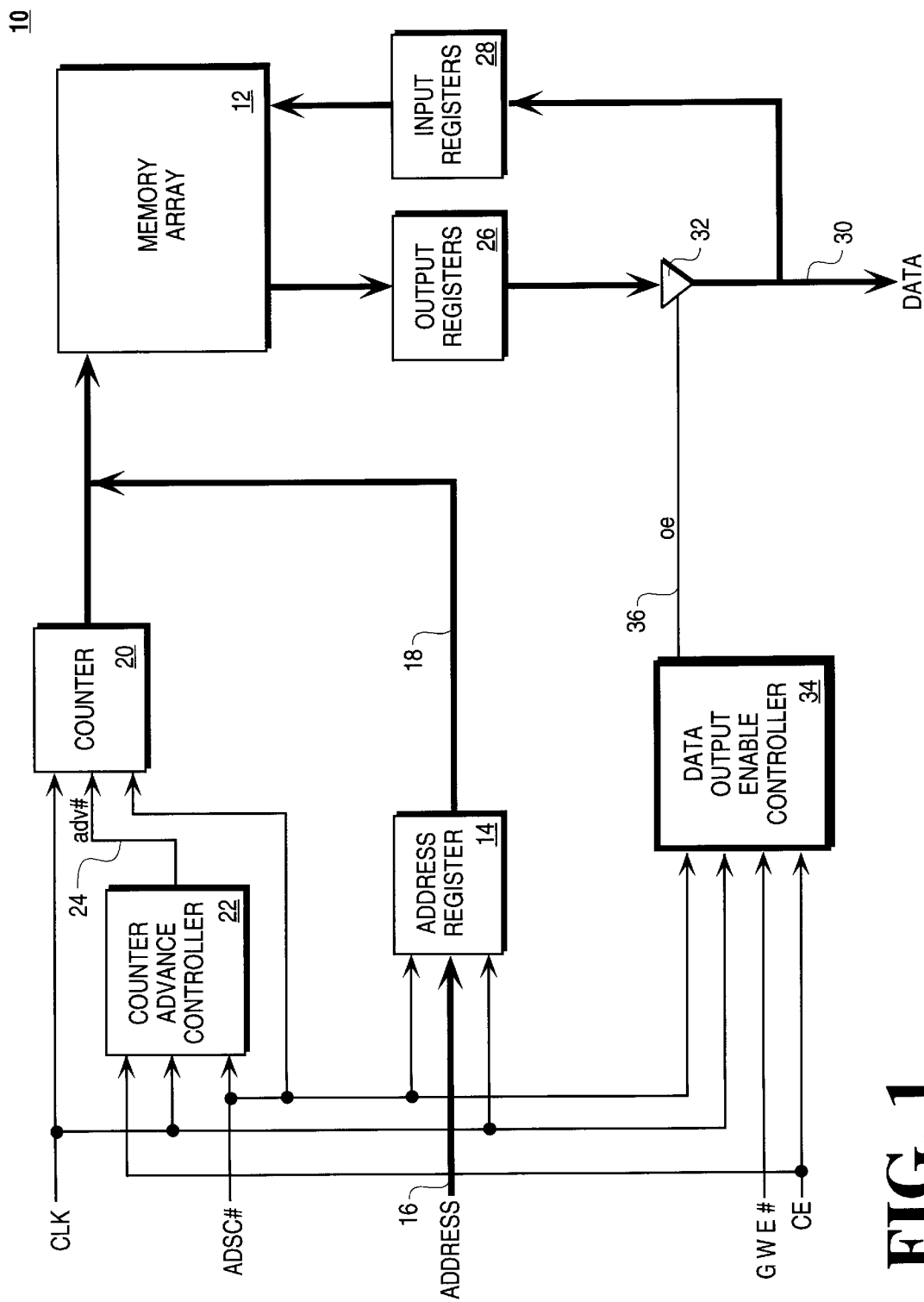
FIG. 1 is a block diagram of an embodiment of a memory device capable of implementing the teachings of the present invention.

FIG. 1 is a block diagram of an embodiment of a memory device 10 capable of implementing the teachings of the present invention. Memory device 10 can be any type of memory device including a static random access memory (SRAM) or a dynamic random access memory (DRAM). Memory device 10 includes a memory array 12 capable of storing various types of data. An address register 14 receives address information on address input signal lines 16. An address bus 18 couples address register 14 to memory array 12. Address bus 18 communicates address information stored in address register 14 to memory array 12. A counter 20 is also coupled to memory array 12 using address bus 18. Counter 20 receives multiple input signals, including a clock signal (CLK). Counter 20 also receives a start of cycle signal (ADSC#, active low) indicating the start of a memory read cycle or a memory write cycle. ADSC# is synchronized with the rising edge of CLK. The CLK and ADSC# signals are also communicated to a counter advance controller 22, address register 14, and a data output enable controller 34. Additional details regarding the ADSC# signal are provided below.

Counter advance controller 22 receives the CLK and ADSC# signals as well as a chip enable (CE) signal. In response to these input signals, counter advance controller 22 generates a counter advance signal (adv#, active low), which is provided to counter 20 on a signal line 24. When the adv# signal is received by counter 20, the counter increments its current value. The value of counter 20 is provided on address bus 18 along with the information from address register 14. The combination of the counter value and the address information identifies a particular memory entry (e.g., a word or chunk of data) within memory array 12. For example, memory array 12 may contain multiple lines, in which each line contains four words. In this example, the address provided by address register 14 indicates a particular line within memory array 12 and the value of counter 20 indicates a particular entry (e.g., word) within the particular line. In the situation where four words are provided in each line, counter 20 has four different values or states (e.g., 0 through 3). Additional details regarding the operation of counter 20 and counter advance controller 22 are provided below.

Memory device 10 also includes output registers 26 and input registers 28 coupled to memory array 12. Output registers 26 receive data from memory array 12 and transmit the data through a tri-state buffer 32 to a data bus 30. Data bus 30 is coupled to multiple pins of memory device 10 for exchanging data with external devices. Data bus 30 is also coupled to input registers 28. Input registers 28 receive data from data bus 30 and transmit the data to memory array 12.

Data output enable controller 34 receives the CLK, ADSC#, and CE signals as well as a global write signal (GWE#, active low). In response to these signals, data output enable controller 34 generates an output enable signal (oe). The (oe) signal enables or disables the flow of data through buffer 32. The GWE# signal indicates whether the current cycle is a read cycle or a write cycle. A read cycle is indicated by GWE#=1 (inactive) and a write cycle is indicated by GWE#=0 (active). The (oe) signal is transmitted to tri-state buffer 32 on a signal line 36. The (oe) signal controls the status of tri-state buffer 32, thereby controlling the flow of data from output registers 26 to data bus 30. Typically, during a read cycle, when valid data is ready to be driven onto data bus 30, the (oe) signal is continuously activated.

In an embodiment of the invention, data output enable controller 34 is a logic device configured to generate an (oe) signal based on the GWE# and CE signals. In another embodiment of the invention, data output enable controller 34 is a state machine performing operations necessary to generate the (oe) signal. Additional details regarding the operation of data output enable controller 34 are provided below.

Figure 2:
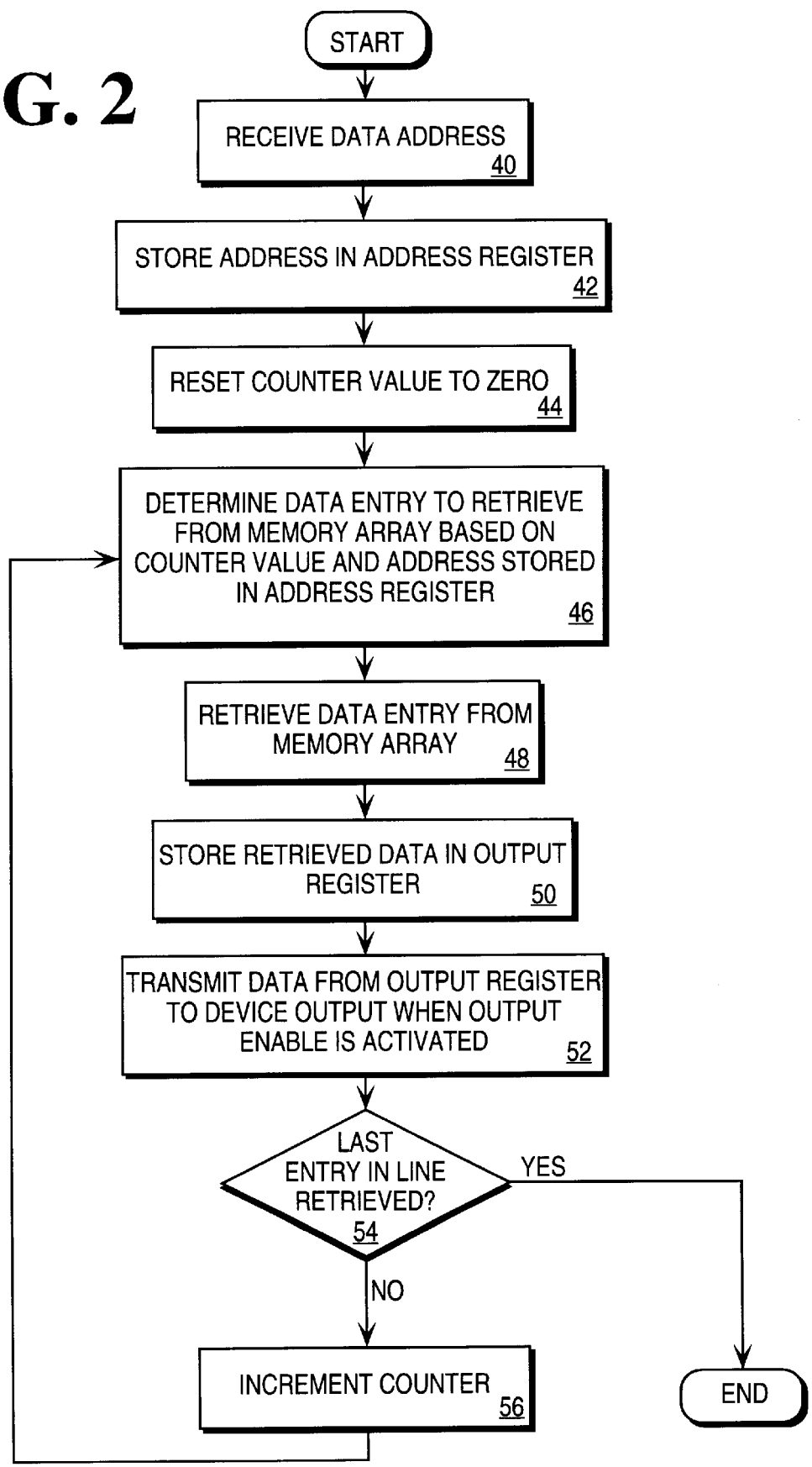
FIG. 2 is a flow diagram illustrating an embodiment of a procedure for reading data from a memory array.

FIG. 2 is a flow diagram illustrating an embodiment of a procedure for reading data from a memory array, such as memory array 12 shown in FIG. 1. At step 40, a data address is received, indicating the address of the data to be read from the memory array. At step 42, the received address is stored in an address register (e.g., address register 14 in FIG. 1). The current value of the counter (e.g., counter 20) is reset to zero at step 44. The address is used to identify a specific data line in the memory array and an offset of the first data element (referred to as the "critical chunk"). The counter is then used to determine the particular order in which the data elements are read from the data line.

Step 46 of FIG. 2 determines the data entry to retrieve from the memory array based on the counter value and the address stored in the address register. The particular data entry to retrieve is stored in a particular memory location within the memory array. For example, as discussed above, the address can identify a particular line and offset within the memory array, and the counter identifies a particular data entry (e.g., word) within the line. Since the counter was reset to zero in step 44, the first data entry in the line will be identified by step 46. As the counter is incremented, subsequent data entries in the line will be identified.

Step 48 of FIG. 2 retrieves the data entry, identified at step 46, from the memory array. The procedure then stores the retrieved data in an output register (e.g., output register 26) at step 50. Step 52 transmits the data from the output register to the device output when the output enable signal is activated, thereby activating a buffer or similar device (e.g., tri-state buffer 32) for communicating the data to the device output. The procedure continues to Step 54 to determine whether the last entry in the line identified by the address has been retrieved. If the last entry in the line has been retrieved, then the read procedure ends with respect to the particular line identified by the address. If the line contains additional entries, then step 56 increments the counter, and the procedure returns to step 46 to identify the next data entry based on the new counter value.

Figure 3:
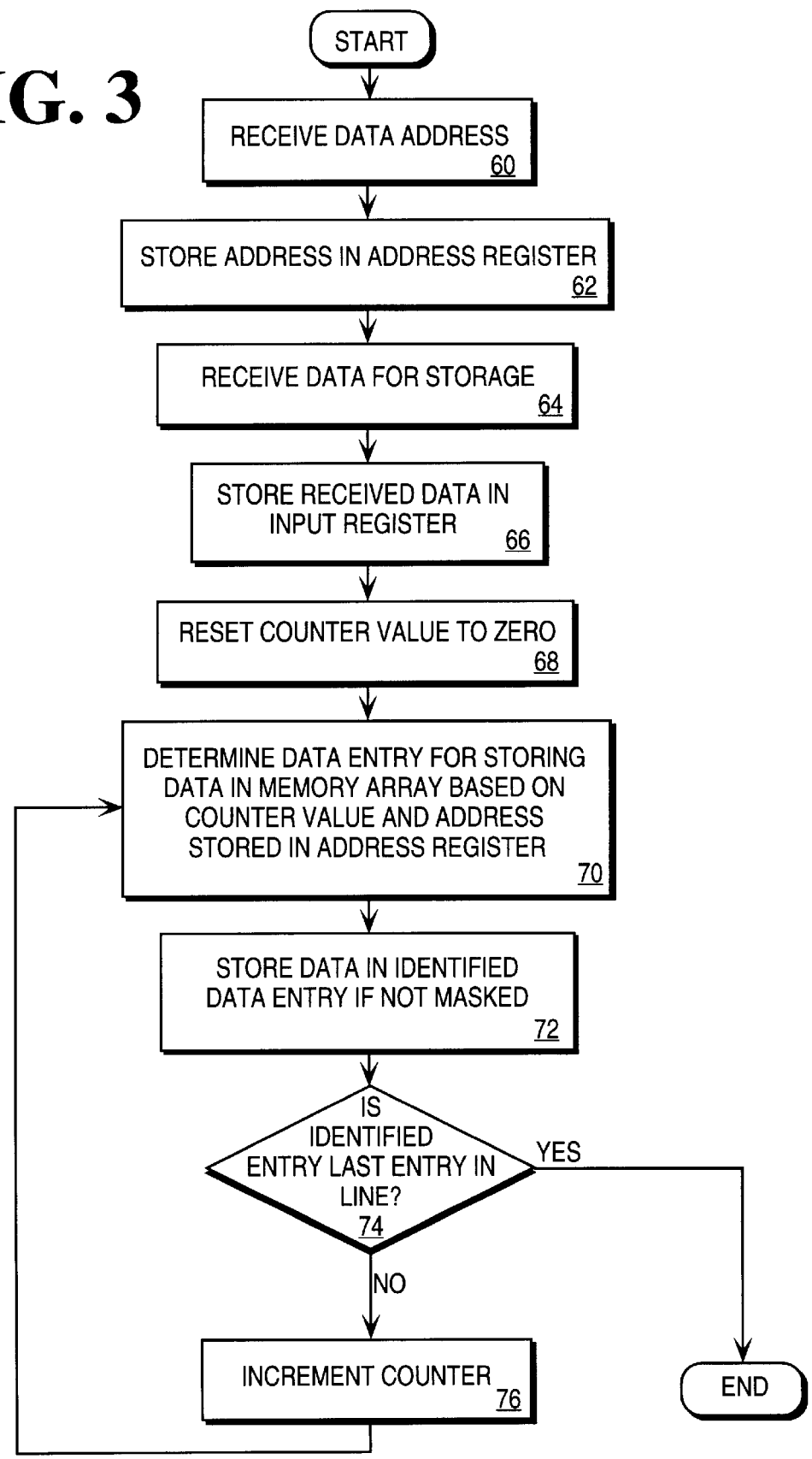
FIG. 3 is a flow diagram illustrating an embodiment of a procedure for writing data to a memory array.

FIG. 3 is a flow diagram illustrating an embodiment of a procedure for writing data to a memory array (e.g., memory array 12 in FIG. 1). A data address is received at step 60 and stored in an address register at step 62. The data to be stored in the memory array is received at step 64 and stored in an input register (e.g., input register 28) at step 66. At step 68, the counter value is reset to zero. Step 70 determines the data entry in which the received data will be stored in the memory array based on the counter value and the address stored in the address register. As mentioned above, the address is used to identify a specific data line in the memory array and an offset of the first data element (referred to as the "critical chunk"). The counter is then used to determine the particular order in which the data elements are read from the data line.

Step 72 of FIG. 3 stores the received data in the identified data entry if the data entry is not masked. As discussed in greater detail below, embodiments of the invention use write masking to indicate the number of words to be written during a particular write cycle. If the data entry is masked, then the data is not written to the memory array. In the example discussed above, the address stored in the address register identifies a particular line in the memory array and the counter identifies a particular data entry within the line.

Step 74 of FIG. 3 determines whether the identified data entry is the last entry in the line. If the identified entry is the last entry, then the write procedure ends with respect to the particular line identified by the address. If the identified entry is not the last entry in the line, then step 76 increments the counter. The procedure then returns to step 70 to identify the next data entry for storing data.

Figure 4:
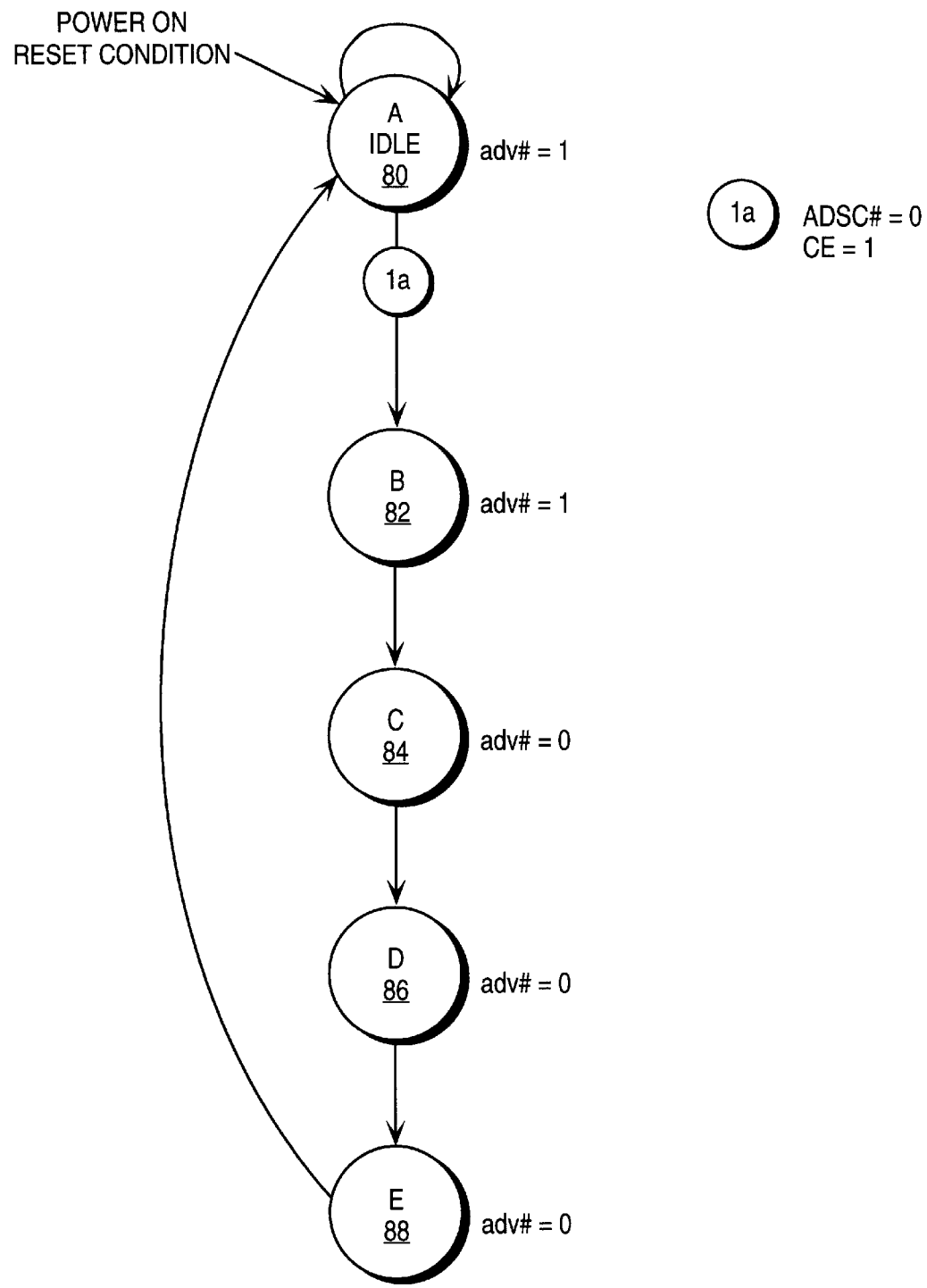
FIG. 4 is a state diagram illustrating an embodiment of the operation of a procedure for generating a counter advance signal.

FIG. 4 is a state diagram illustrating an embodiment of the operation of a procedure for generating a counter advance signal. When active, the counter advance signal (adv#) causes the counter to increment. The state machine shown in FIG. 4 will be described with reference to the embodiment discussed above in which the memory array has multiple lines with four words in each line. When the device or system is powered-up or reset, the state machine is set to state 80, an idle state. ADSC# indicates the start of a new read cycle or a new write cycle. The state machine changes from state 80 to state 82 when ADSC# is active (low) and the device is enabled (CE =1). The counter is not advanced at state 82, such that the counter indicates the first word in the identified line. The state machine then changes to state 84 where the counter is incremented to indicate the second word in the line. At state 86, the counter is incremented again to indicate the third word in the line. Finally, at step 88, the counter is incremented to indicate the fourth word in the line. Thus, after incrementing the counter at step 88, all four words in the line have been identified by the counter. The state machine then returns to idle state 80 to await the next cycle start, indicated by ADSC#.

When performing a write cycle, the GWE# signal is used to indicate the number of words to be written into the line. This procedure may be referred to as write masking. If GWE# is active (low) for four or more clock cycles, then four words are written into the line. If GWE# is active for three clock cycles, then three words are written into the line. Similarly, two words are written if GWE# is active for two clock cycles and one word is written if GWE# is active for one clock cycle.

This write masking operation allows the same memory control system to be utilized, regardless of the number of words (or chunks of data) being written to the memory array. A single control system simplifies the overall operation of the memory device instead of requiring four separate control systems for each situation (writing one, two, three, and four words). Additional details regarding the GWE# signal and write masking are discussed below with reference to FIG. 10.

Figure 5:
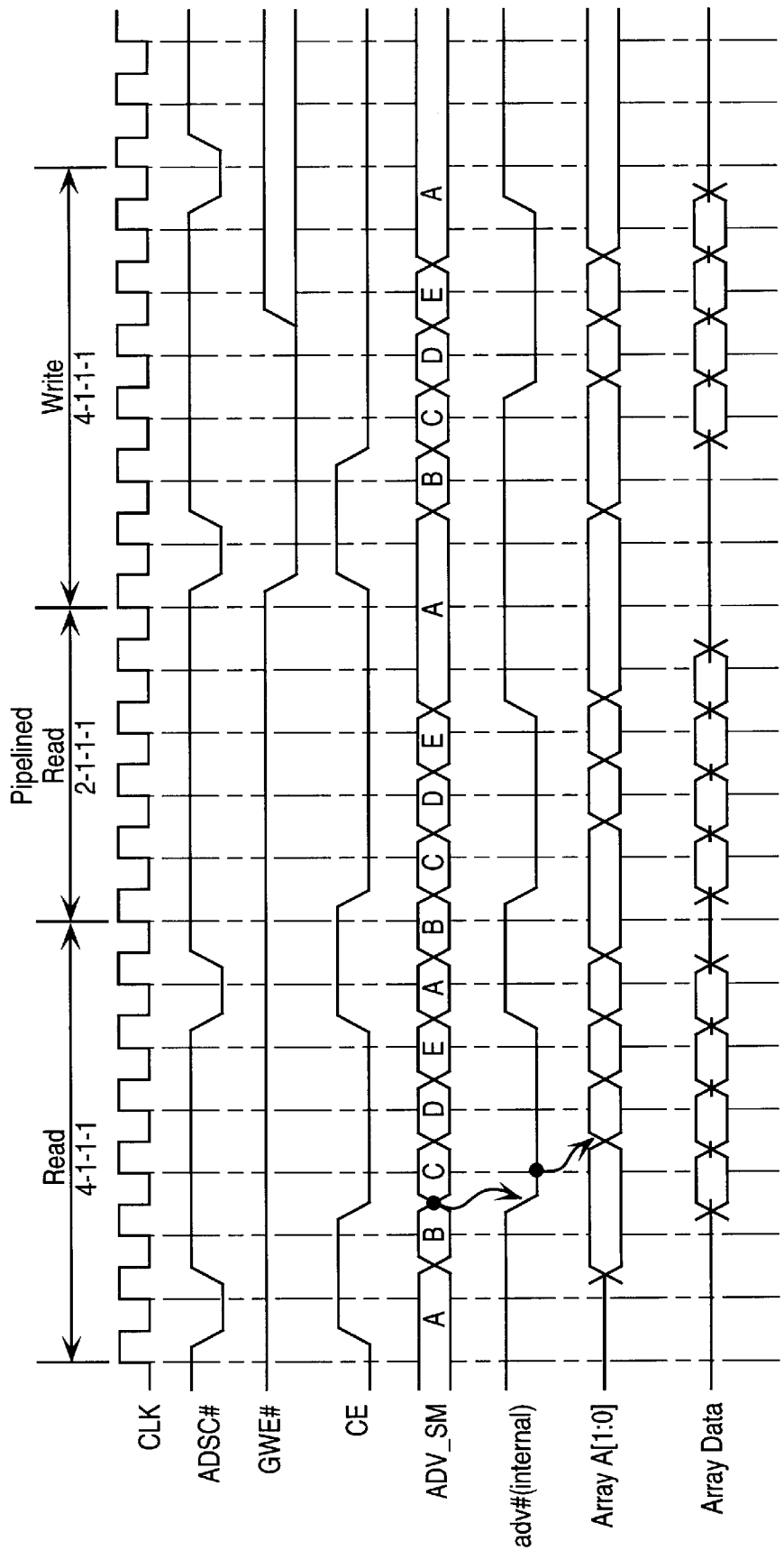
FIG. 5 is a timing diagram illustrating an embodiment of various signals utilized by a memory device.

FIG. 5 is a timing diagram illustrating an embodiment of various signals utilized by a memory device. The various states of the state machine shown in FIG. 4 are illustrated in the timing diagram as signal ADV_SM. The left portion of FIG. 5 illustrates a read cycle, the center portion of FIG. 5 illustrates a pipelined read cycle, and the right portion of FIG. 5 illustrates a write cycle. The notation 4-1-1-1 indicates the number of clocks (i.e., clock cycles) required to retrieve data from (read cycle) or store data to (write cycle) the memory array. For example, in a read cycle the "4" indicates the number of clocks required to retrieve the initial data from the memory array. The three 1s indicate the number of clocks required to retrieve the subsequent data from the memory array. Thus, the initial data is retrieved after four clocks, and subsequent data is retrieved on each following clock.

Figure 6:
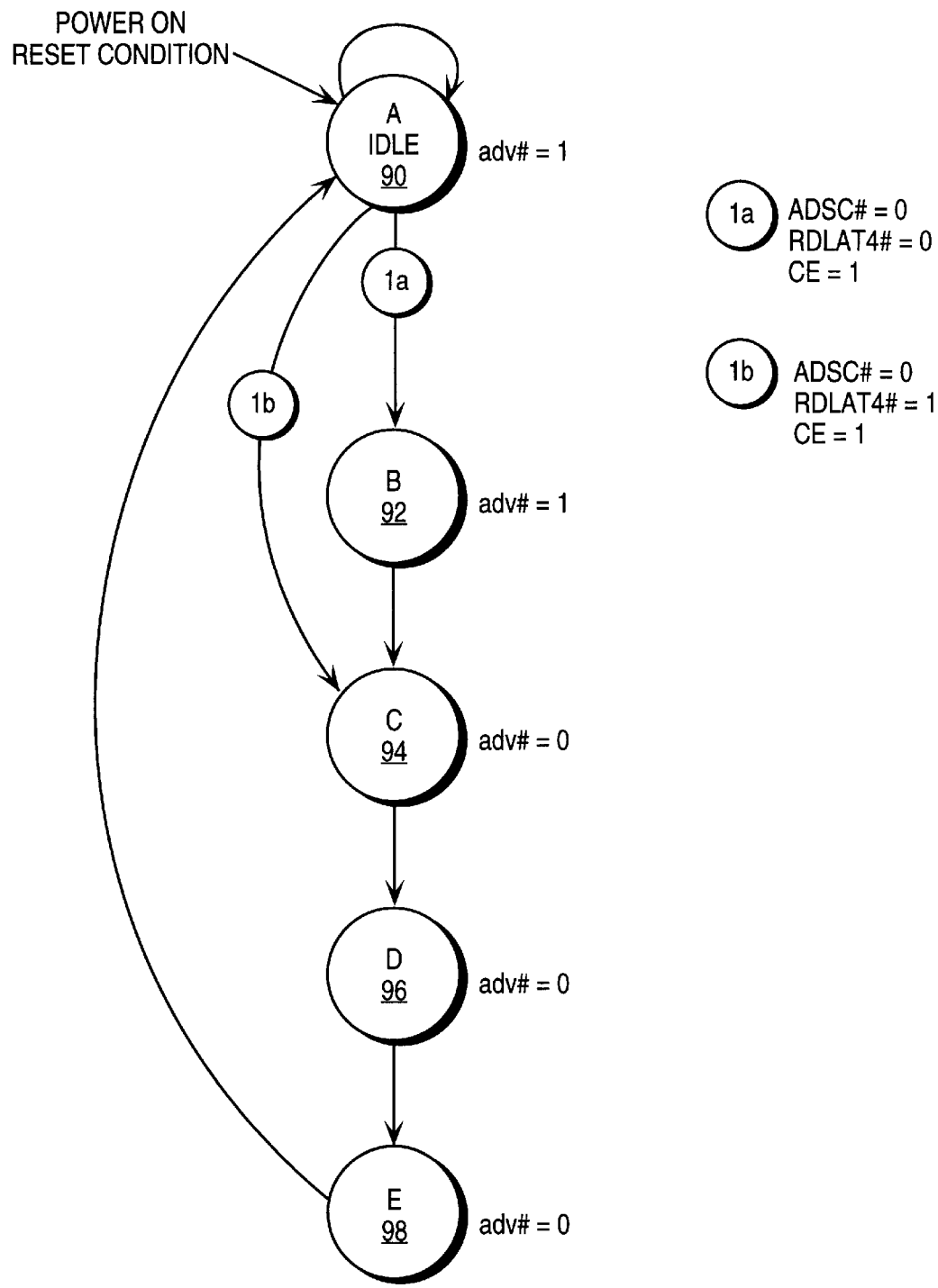
FIG. 6 is a state diagram illustrating another embodiment of the operation of a procedure for generating a counter advance signal.

FIG. 6 is a state diagram illustrating another embodiment of the operation of a procedure for generating a counter advance signal. The state machine of FIG. 6 is similar to the state machine shown in FIG. 4, but operates in one of two different modes depending on the value of signal RDLAT4#. RDLAT4# indicates the read latency that has been selected for the device. For example, if RDLAT4#=0 (active), then the state machine of FIG. 6 operates with a read latency of 4. This operation is the same as the state machine shown in FIG. 4. However, if RDLAT4#=1, then the state machine of FIG. 6 operates with a read latency of 3. In this situation, the state machine changes from idle state 90 to state 94, skipping step 92. From step 94, the state machine changes though states 96 and 98 in the same manner as discussed above with reference to FIG. 4. The use of multiple read latency settings permits the memory device to be utilized in various types of systems and in different configurations. The state machine of FIG. 6 illustrates support for read latencies of 3 and 4. However, those of ordinary skill in the art will appreciate that various combinations of read latencies may be supported by a particular device.

Figure 7:
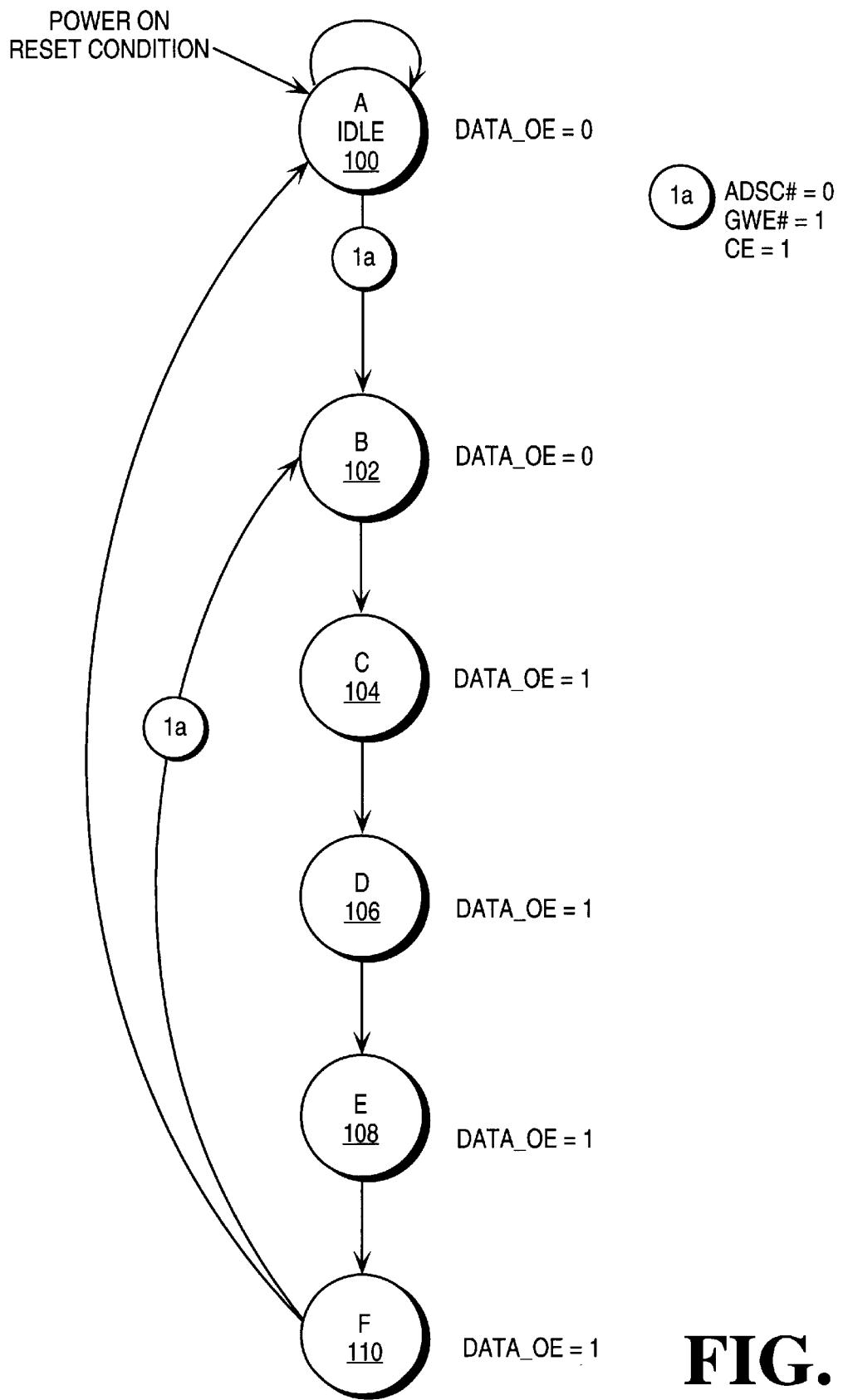
FIG. 7 is a state diagram illustrating an embodiment of the operation of a procedure for generating an output enable signal.

FIG. 7 is a state diagram illustrating an embodiment of the operation of a procedure for generating an output enable signal. When active, the output enable signal (oe) causes data in an output register to be transmitted to a device output. The state machine shown in FIG. 7 will be described with reference to the embodiment discussed above in which the memory array has multiple lines with four words in each line. When the device or system is powered-up or reset, the state machine is set to state 100, an idle state. As discussed above, ADSC# indicates the start of a new cycle, and GWE# indicates whether the new cycle is a read cycle (GWE#=1) or a write cycle (GWE#=0). Since the output enable signal is only generated during a read cycle, the state machine changes from state 100 to state 102 when GWE#=1, ADSC#=0, and the device is enabled (CE =1). At state 102, the output enable signal remains inactive. The state machine then changes to state 104 and the output enable signal is activated. The state machine then changes to states 106, 108, and 110, all of which maintain an active output enable signal. Thus, the output enable signal is active for four clocks, thereby permitting the four words to be read from the line in the memory array.

From state 110, the state machine returns to state 100 or state 102, based on the value of ADSC# and GWE#. If ADSC#=0, indicating the start of a new cycle, and GWE#= 1, indicating a read cycle, then the state machine returns to state 102, bypassing idle state 100. If ADSC#=1 or GWE#=0, then the state machine returns to idle state 100 to await the start of the next read cycle.

As illustrated by the state machine of FIG. 7, the output enable signal is active only when needed to retrieve data from the output register. After the last unit of data is retrieved from the output register, the output enable signal is deactivated, thereby tri-stating the data buffer. Activating the output enable signal only when needed minimizes the power consumption required by the device. Additionally, since the device tri-states its output buffer as soon as the data has been read, other devices can immediately begin using the data bus.

Figure 8:
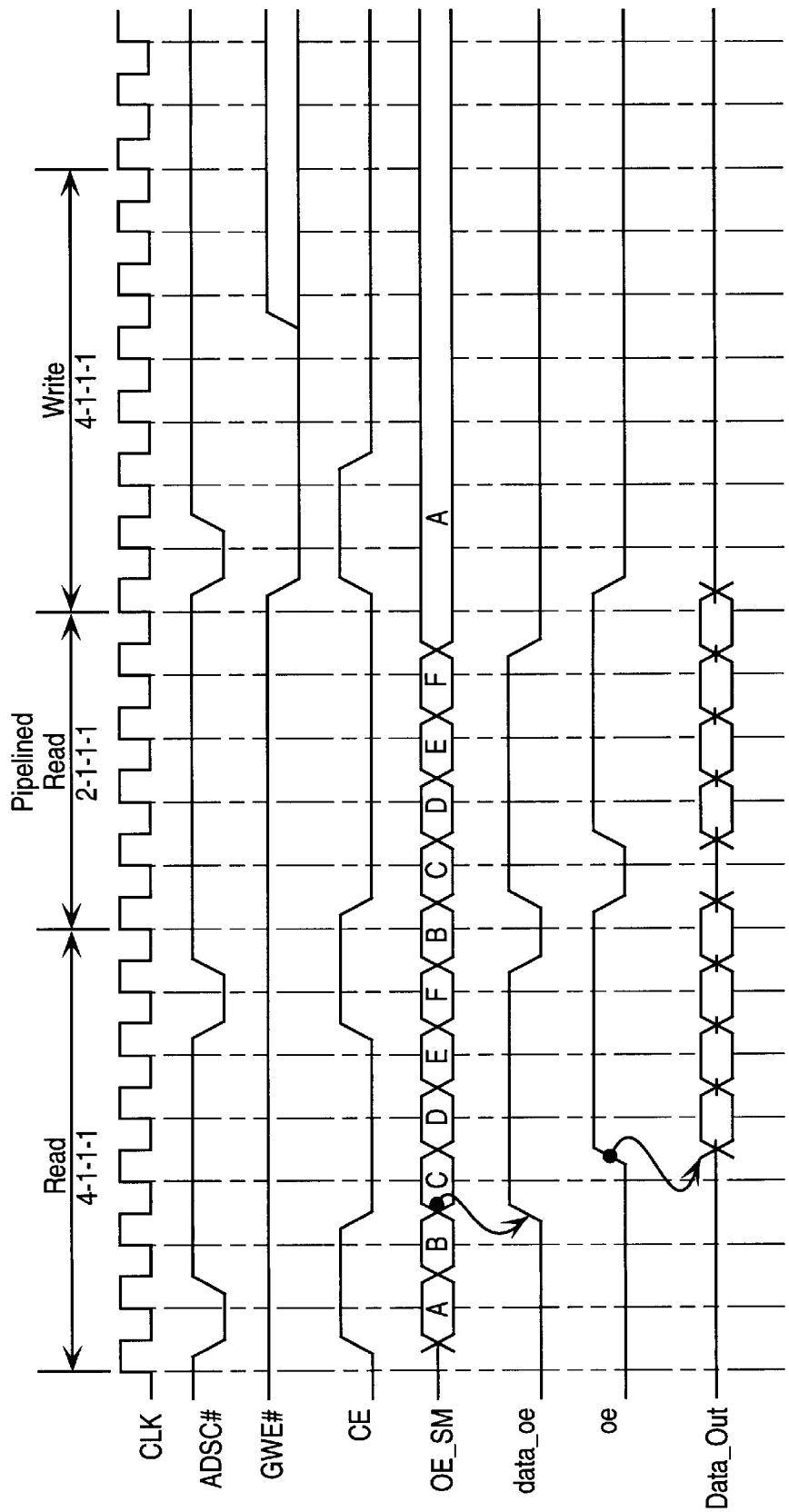
FIG. 8 is a timing diagram illustrating another embodiment of various signals utilized by a memory device.
Figure 9:
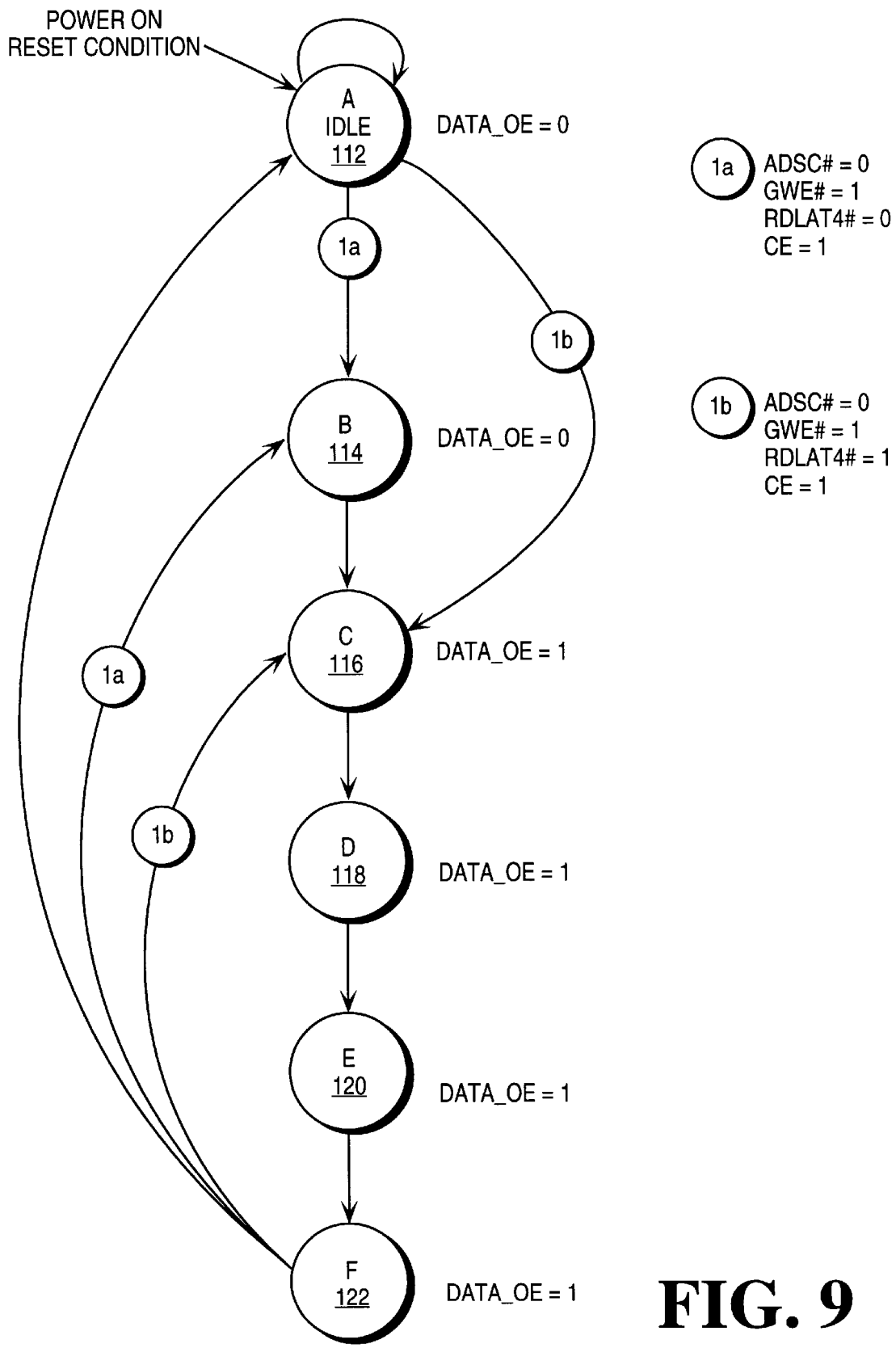
FIG. 9 is a state diagram illustrating another embodiment of the operation of a procedure for generating an output enable signal.

FIG. 8 is a timing diagram illustrating another embodiment of various signals utilized by a memory device. The various states of the state machine shown in FIG. 7 are illustrated in the timing diagram as signal OE_SM. The left portion of FIG. 8 illustrates a read cycle, the center portion of FIG. 8 illustrates a pipelined read cycle, and the right portion of FIG. 9 illustrates a write cycle. Since the output enable signal is not activated during a write cycle, the state machine remains idle (state A) during the write cycle.

FIG. 9 is a state diagram illustrating another embodiment of the operation of a procedure for generating an output enable signal. The state machine of FIG. 9 is similar to the state machine shown in FIG. 7, but operates in one of two different modes depending on the value of signal RDLAT4#. As discussed above, RDLAT4# indicates the selected read latency. If RDLAT4#=0 (active), then the state machine of FIG. 9 operates in the same manner as the state machine shown in FIG. 7 (read latency of 4). However, if RDLAT4#= 1, then the state machine of FIG. 9 operates with a read latency of 3. The state machine changes from idle state 112 to state 116, skipping step 114. From step 116, the state machine changes though states 118, 120, and 122 as discussed above with reference to FIG. 7. Upon reaching state 122, if RDLAT4#=1, then the state machine returns to state 116. If RDLAT4#=0, then the state machine returns from state 122 to state 112 or 114, as discussed above with reference to FIG. 7.

Figure 10:
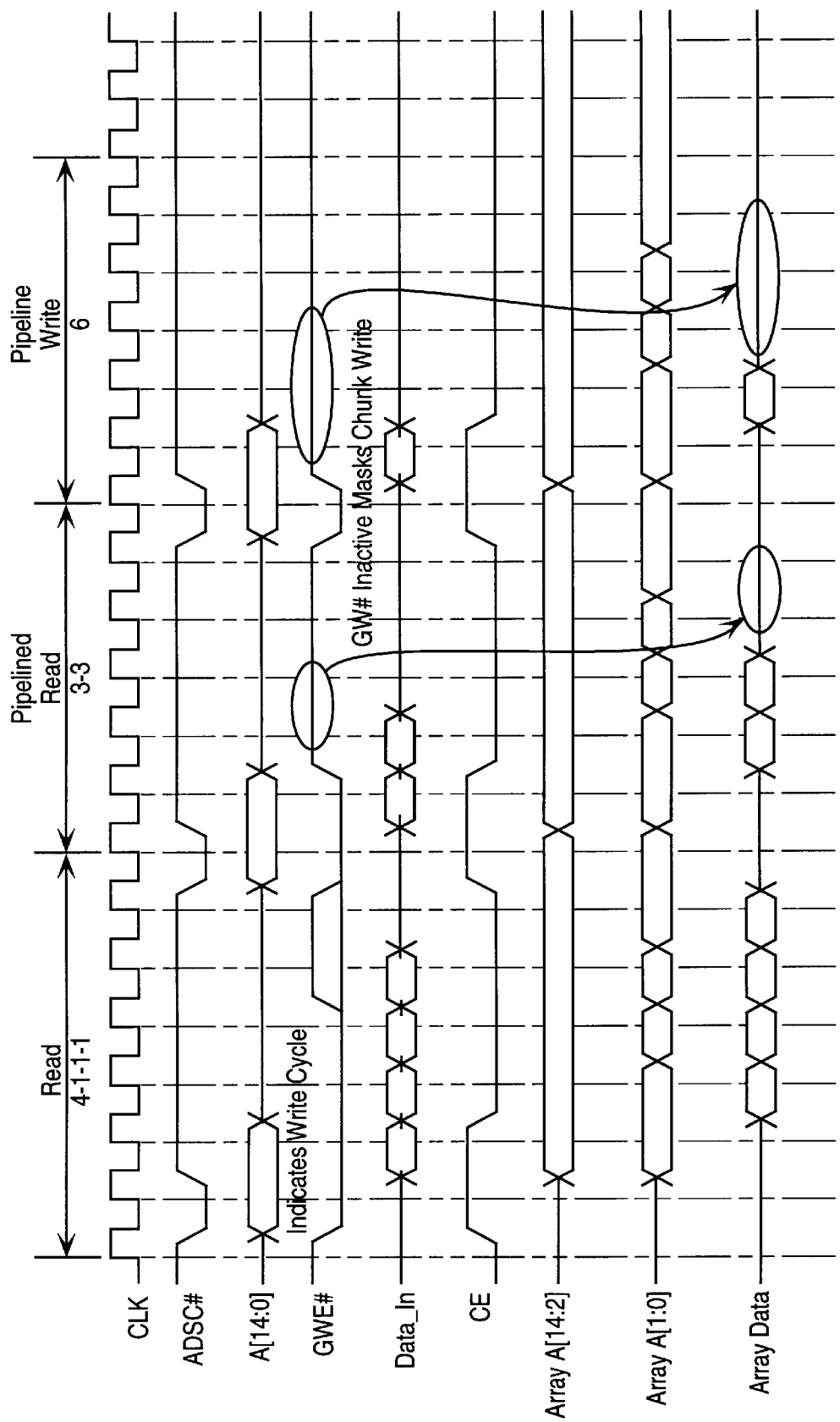
FIG. 10 is a timing diagram illustrating various signals utilized by a memory device.

FIG. 10 is a timing diagram various signals utilized by a memory device. In particular, FIG. 10 illustrates a write masking operation that may be implemented by a memory device. As discussed above, during a write operation, the GWE# signal is used to indicate the number of words (or chunks of data) that will be written to the memory array during the write cycle. As shown in FIG. 10, if GWE# is low (active) for two clock cycles, only two words are written to the memory array. In this situation, the remaining two words are masked (i.e., not written to the memory array). Similarly, if GWE# is low for one clock cycle, only one word is written and the remaining three words are masked. If GWE# is low for three clock cycles, then three words are written and the remaining word is masked.

As discussed above, the write masking operation allows the same memory control system (and the same state machines) to be utilized, regardless of the number of words or chunks of data being written to the memory array. The single control system simplifies the overall operation of the memory device as compared to systems that require a separate control for each situation (i.e., a control for writing one, two, three, and four words).

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. A control mechanism for controlling the operation of a memory device, wherein the control mechanism is contained within the memory device, the control mechanism comprising:
   a buffer configured to receive data stored in the memory device and transmit the data to an output of the device; and
   an output enable generator coupled to the buffer, wherein the output enable generator generates an output enable signal, and wherein the output enable signal enables either a read operation or a write operation.

2. The control mechanism of claim 1 wherein the output enable generator implements a state machine to control data flow through the buffer.

3. The control mechanism of claim 1 wherein the memory device is a static random access memory.

4. A control mechanism for controlling the operation of a memory device having a memory array, wherein the control mechanism is contained within the memory device, the control mechanism comprising:
   a counter coupled to the memory array, wherein the counter identifies a memory entry within the memory array; and
   a logic device coupled to the counter, wherein the logic device controls operation of the counter with an advance signal, and wherein the advance signal is generated by the logic device.

5. The control mechanism of claim 4 further including an address register coupled to the counter and the memory array.

6. The control mechanism of claim 5 wherein the logic device selects a particular memory entry in the memory array based on information contained in the address register and the counter.

7. The control mechanism of claim 4 wherein the memory array includes a plurality of data lines, wherein each data line stores a plurality of data entries.

8. The control mechanism of claim 7 wherein the counter identifies a particular data entry in a selected data line.

9. The control mechanism of claim 7 further including an address register coupled to the counter and the memory array, wherein the address register identifies a particular data line and data offset, and the counter determines a particular order for accessing the data in the particular data line.

10. The control mechanism of claim 7 wherein the logic device is configured to mask a data entry in response to a received control signal.

11. The control mechanism of claim 4 wherein the device is a static random access memory.

12. A device comprising:
    a memory array configured to store data;
    a counter coupled to the memory array, wherein the counter is configured to identify a memory entry within the memory array; and
    a logic device coupled to the counter and configured to control operation of the counter with an advance signal, wherein the advance signal is generated by the logic device.

13. The device of claim 12 further including an address register coupled to the counter and the memory array.

14. The device of claim 13 wherein the logic device is configured to select a particular memory entry in the memory array based on information contained in the address register and the counter.

15. The device of claim 13 wherein the address register identifies a particular data line and data offset, and the counter determines a particular order for accessing the data in the particular data line.

16. The device of claim 12 wherein the memory array includes a plurality of data lines, each data line being configured to store a plurality of data entries.

17. The device of claim 16 wherein the counter identifies a particular data entry in a selected data line.

18. The device of claim 16 wherein the logic device is configured to mask a data entry in response to a received control signal.

19. A control mechanism for controlling the operation of a memory device, wherein the control mechanism is contained within the memory device, the control mechanism comprising:
    means for receiving data stored in the memory device and transmitting the data to an output of the device; and
    means for controlling data flow through the means for receiving data stored in the memory device, the means for controlling configured to generate an output enable signal that controls the data flow through the means for receiving data stored in the memory device, wherein the output enable signal enables either a read cycle or a write cycle.

20. The control mechanism of claim 19 wherein the means for controlling data flow implements a state machine to control the data flow.

* * * * *